United States Patent [19]

Menzel

[11] 4,325,776
[45] Apr. 20, 1982

[54] METHOD FOR PREPARING COARSE-CRYSTAL OR SINGLE-CRYSTAL METAL FILMS

[75] Inventor: Günter Menzel, Munich, Fed. Rep. of Germany

[73] Assignee: Siemens Aktiengesellschaft, Berlin and Munich, Fed. Rep. of Germany

[21] Appl. No.: 157,890

[22] Filed: Jun. 9, 1980

Related U.S. Application Data

[63] Continuation of Ser. No. 917,381, Jun. 20, 1978, abandoned.

[30] Foreign Application Priority Data

Jun. 20, 1977 [DE] Fed. Rep. of Germany ....... 2727659

[51] Int. Cl.³ .............................................. C30B 23/06
[52] U.S. Cl. .................................. 156/610; 427/250; 427/295; 427/299; 427/376.7; 427/383.1; 427/383.3; 204/192 M; 204/192 C
[58] Field of Search ............... 427/250, 374 A, 383 R, 427/255, 295, 314, 318, 376.6, 376.7; 156/603, 610, 299, 383.3, 383.1; 204/192 M, 192 C

[56] References Cited

U.S. PATENT DOCUMENTS 3,036,933 5/1962 Caswell ............................... 427/250

OTHER PUBLICATIONS

Keith, An X-ray Study in High Vac. of Structure of Evap. Copper Films, Proc. Phys. Soc., 69-B, 180 (1956).
Powell et al., Vapor Deposition, John Wiley & Sons, Inc., N.Y. 1966.

Primary Examiner—Shrive P. Beck
Assistant Examiner—Richard Bueker
Attorney, Agent, or Firm—Kenyon & Kenyon

[57] ABSTRACT

For preparing coarse-crystal or single-crystal metal films by vapor-depositing or atomizing a metal on a substrate, an amorphous layer of Ta, W, Cu, Co, Al or an aluminum alloy or a Ti-V alloy with a vanadium content of more than about 70 atom percent is first precipitated on the substrate which is cooled to a temperature below about $-90°$ C. Subsequently, the amorphous layer is recrystallized by heating the substrate with the deposited metal layer to at least room temperature and maximally 300° C. The so-prepared metal films have particular application to integrated circuits.

1 Claim, 1 Drawing Figure

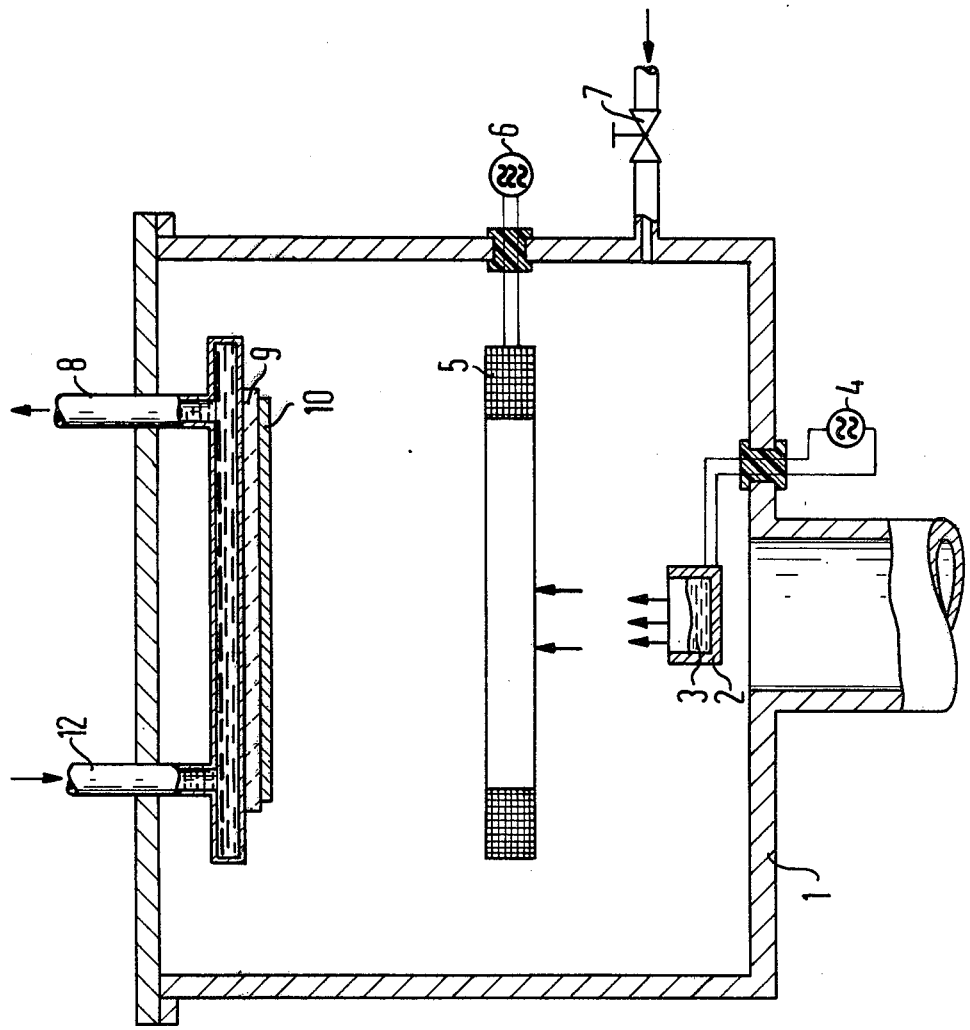

METHOD FOR PREPARING COARSE-CRYSTAL OR SINGLE-CRYSTAL METAL FILMS

This is a continuation of application Ser. No. 917,381, filed June 20, 1978, now abandoned.

BACKGROUND OF THE INVENTION

The invention relates to a method for preparing coarse-crystal or single-crystal metal films, wherein a metal is precipitated as a layer on a suitable substrate by vapor deposition or atomizing.

In electrical engineering and in particular, in semiconductor technology, thin metal films are used for conductors, electric resistors or as capacitor electrodes. These components must exhibit very long life and their electrical properties must be highly stable under varying thermal stresses. Thus, such metal films must withstand, for example, short-time temperature stresses of up to about 400° C. as well as continuous temperature rises to approximately 150° C. without change of their properties.

Such metal films are usually prepared by vapor deposition or sputtering on substrates such as glass, silicon or ceramic material. These metal layers are generally of fine-crystalline structure. Thus, tantalum, for example, which is vapor-deposited or sputtered-on at a substrate temperature of 150° C., has a grain size of about 10 nm. The property of the films in having a fine-crystalline structure can result in various disadvantages depending on the eventual application of the films. If components provided with such metal layers are, for example, operated at elevated temperatures, then grain growth can occur in these fine-crystalline metal layers, which considerably changes their properties, for example, the electric resistance as well as the temperature coefficient of the electric resistance. If such fine-crystalline metal films are used as conductors, heavy electro-migration can occur in such conductors at the high current densities required in highly integrated circuits (cf. "Proc. of the IEEE", vol. 59, no. 10 (Oct. 1971), pages 1409 to 1418). The essential cause of electromigration is structural inhomogeneities in the material of the conductor, such as grain boundaries. In order to obtain stable properties of such metal films over a greater temperature range, metal films have heretofore been subjected to an extended heat treatment which, as a rule, leads to grain growth within the layers. Such an annealing process, however, has its problems especially with semiconductor circuits since other, already formed components can be destroyed by the high temperatures required for the heat treatment. Especially in narrow conductors, growth of the grain boundary surfaces across the entire conductor can be caused by such an annealing process. If a current load is applied to the conductor, this in turn leads to increased electromigration at these points, which in turn leads to a failure of the conductor and thereby, of the component. It is desirable to find for the conductors a material which does not exhibit such electromigration. This could be achieved by very coarse-crystal or single-crystal metal layers.

SUMMARY OF THE INVENTION

It is, therefore, an object of the invention to describe for a method for preparing coarse-crystal or single-crystal metal films, measures which ensure that these metal layers can be developed in coarse-crystal or single-crystal form at low temperatures, and in which the diameter of the individual crystal bodies of these metal layers is larger than about 50 μm.

According to the invention, this problem is solved for a method for producing coarse-crystal or single-crystal metal films, wherein a metal is precipitated as a layer on the surface of a substrate by vapor deposition or atomizing by:

(a) maintaining the substrate at a temperature below about −90° C. for precipitation of the metal thereon;

(b) precipitating as a layer on the cooled substrate a metal selected from the group consisting of tantalum, tungsten, copper, cobalt, aluminum, alloys of aluminum and titanium-vanadium alloys having a vanadium content of greater than about 70 atom percent; and (c) heating the substrate having said metal layer deposited thereon to at least about room temperature.

As used in the present invention, "heating" of the substrate having the precipitated metal layer thereon is intended to encompass either simply allowing the substrate/metal layer to rise to room temperture, e.g., by terminating the maintenance of the substrate at low temperatures, or, alternatively, by overtly applying heat to the substrate/metal layer. In the latter case, the maximum temperature to which the substrate having the metal layer thereon should be raised is about 300° C.

It is preferred that the precipitation of the metal as a layer on the substrate be conducted in a high vacuum at a residual gas pressure of less than about $10^{-8}$ Torr.

Further, preferred embodiments of the invention will be apparent from the description which follows.

The metal films prepared by the method according to the invention have substantial advantages over the metal layers produced heretofore. Thus, these layers exhibit no variation of their film properties, for example, of their electric resistance, at elevated temperatures. For this reason, it is not necessary to subject these layers to temperature processes, whereby, in addition, the detrimental effects of the annealing processes on already existing components of an integrated circuit are avoided. The metal films produced with the method according to the invention furthermore have a grain diameter which is so large that in an integrated circuit, individual components are connected to each other by a single crystal. The great homogeneity of a single crystal permits higher current densities without having to expect failures due to electromigration.

If the metal layers prepared by the method according to the invention are used for thin-film capacitors, such thin-film capacitors have a high dielectric strength due to the very homogeneous material and, therefore, also very long life.

BRIEF DESCRIPTION OF THE FIGURE

The FIGURE diagrammatically shows an apparatus for carrying out the method of the present invention.

DETAILED DESCRIPTION OF THE INVENTION

In the following, the invention will be described with the aid of an embodiment example and explained in greater detail with the aid of the FIGURE.

In a vessel 1 which can be evacuated to an ultra-high vacuum is located an evaporation crucible 2 which contains the metal 3 to be deposited. Opposite the evaporation crucible is arranged a substrate holder 8, through which a cooling liquid 12 can be pumped. On the substrate holder 8 is fastened the substrate 9, on which the metal film 10 to be prepared is precipitated. For evaporating the metal 3 contained in the crucible, the latter can be heated, for example, electrically by a current source 4. If the material of the layer 10 is to be precipitated not by evaporation but by sputtering, argon is admitted into the vessel via a valve 7. The partial argon pressure is, for example, 1 Pa ($10^{-2}$ Torr). The ions required for sputtering are generated, for example, by means of a high-frequency coil 5 which is excited by a high-frequency voltage source.

As an embodiment example will serve the preparation of a coarse-crystal tantalum layer. For this purpose, tantalum is evaporated from the evaporation crucible 2. By means of the cooling liquid 12, for example, by means of liquid nitrogen or liquid helium, the substrate 9 is cooled to a temperature below $-90°$ C. On the substrate cooled in this manner, tantalum is precipitated as a layer 10 until a layer thickness of, for example, 1 $\mu$m is reached. The cooling of the substrate 9 causes the deposited tantalum layer 10 to be present in the amorphous phase. If now the cooling of the substrate is broken off and the substrate warms up, for example, to room temperature or higher to maximally 300° C., then the amorphous tantalum layer 10 becomes $\alpha$-tantalum through crystallization. This crystallization leads to crystals, the diameter of which is above 70 $\mu$m. The crystallization of the tantalum therefore takes place in tantalum layers prepared in this manner at substantially lower temperatures than with the methods known heretofore, in which the temperature $T_R$ necessary for the recrystallization is about half the melting temperature $T_S$. According to the investigations undertaken in connection with the invention, the metals tungsten, copper, cobalt, aluminum and aluminum alloys as well as the alloy titanium-vanadium with a vanadium content of more than 70 atom percent are suitable, besides tantalum, for the preparation of such coarse-crystal metal layers. The vapor deposition of the material on the substrate 9 is accomplished preferably in an ultra-high vacuum or an inert atmosphere, e.g., a rare gas atmosphere, as in that case no disturbances by the residual gas atmosphere is possible.

What is claimed is:

1. A method for producing coarse-crystal or single-crystal films, comprising:
   (a) providing a cooled substrate maintained at a temperature below about $-90°$ C.;
   (b) precipitating as a layer on said cooled substrate by vapor deposition or atomizing a metal selected from the group consisting of tantalum, tungsten, copper, cobalt, aluminum, aluminum alloys and titanium-vanadium alloys having a vanadium content of greater than about 70 atom percent, said metal layer being present on said substrate in the amorphous phase;
   (c) heating said substrate having said metal layer deposited thereon to about room temperature to produce crystals, the diameter of which is larger than about 50 $\mu$m.

* * * * *